United States Patent [19]
Garuts

[11] Patent Number: 5,189,313
[45] Date of Patent: Feb. 23, 1993

[54] VARIABLE TRANSITION TIME GENERATOR

[75] Inventor: Valdis E. Garuts, Beaverton, Oreg.

[73] Assignee: Tektronix, Inc., Wilsonvile, Oreg.

[21] Appl. No.: 841,761

[22] Filed: Feb. 28, 1992

Related U.S. Application Data

[63] Continuation of Ser. No. 615,120, Nov. 19, 1990, abandoned.

[51] Int. Cl.$^5$ .......................... H03K 6/04; H03K 4/06
[52] U.S. Cl. ..................................... 307/263; 307/228; 307/494; 328/127; 328/185
[58] Field of Search ............... 307/228, 263, 490, 494; 328/127, 184, 185

[56] References Cited

U.S. PATENT DOCUMENTS

| | | | |
|---|---|---|---|
| 3,349,343 | 10/1967 | Luna et al. | 328/184 |
| 3,663,833 | 5/1972 | Pao et al. | 307/494 |
| 3,839,650 | 10/1974 | Wood | 328/127 |
| 4,501,974 | 2/1985 | Miller et al. | 307/228 |
| 4,645,946 | 2/1987 | Ishikawa et al. | 307/263 |
| 4,668,918 | 5/1987 | Adams | 328/127 |
| 4,684,831 | 8/1987 | Kruest | 307/356 |
| 4,745,304 | 5/1988 | Wilson | 307/296.6 |
| 4,806,880 | 2/1989 | Laws | 328/128 |
| 5,039,880 | 8/1991 | Astegner et al. | 307/494 |

Primary Examiner—William L. Sikes
Assistant Examiner—Terry Cunningham
Attorney, Agent, or Firm—John D. Winkelman; Francis I. Gray

[57] ABSTRACT

A variable transition time generator has a differential emitter follower circuit that has a push-pull signal at the inputs for driving each end of a timing capacitor. An independently variable timing current source is coupled to each end of the timing capacitor. A differential buffer amplifier passes the voltage across the timing capacitor to an output. A d.c. compensation circuit has a statically biased emitter follower pair of transistors that are driven independently by a pair of variable compensation current sources that track the independently variable timing current sources, the output of which is combined with the output of the buffer amplifier. Also combined with the output of the buffer amplifier is a step correction output derived from the differential input signal. The result is a high speed variable transition time generator that simultaneously produces independently controllable opposite polarity transitions.

5 Claims, 6 Drawing Sheets

VARIABLE TRANSITION TIME GENERATOR

This is a continuation of application of Ser. No. 07/615,120 filed Nov. 19, 1990, and now abandoned.

BACKGROUND OF THE INVENTION

The present invention relates to timing of pulse transitions, and more particularly to a variable transition time generator for providing continuous and independently controllable transition times for both edges of pulses.

Control of pulse transitions is frequently a necessary function of pulse sources in test and measurement equipment. For example the output transition times of logic device characterization instruments must be matched to the characteristics and test specifications of devices or systems under test. The minimum output transition times and propagation delays of the circuit need to be as short as possible, comparable to the transition times of the logic being tested, which are likely to be comparable to logic fabricated with the same technology as the control circuit. Transition times must be continuously and independently controllable over at least a decade (10:1) range. Typical high speed logic testing equipment requires controlling a large number of output signals simultaneously, using many control circuits in parallel, so that simplicity and low power and cost in each signal path is necessary.

The requirements in terms of speed and scale, as well as cost, dictate integration to as large a degree as possible, as opposed to discrete or multichip per pin solutions. The needed speed, precision and integration density tend to favor a modern silicon bipolar process, although with suitable adjustments other devices than bipolar transistors, such as FETs, or other processes, such as GaAs, may also be used.

A typical prior art pulse transition time control circuit used in slower applications is shown in FIG. 1. When the control input Vin is negative, the positive timing current Itp flows through QP1, and the negative timing current Itn through QN2 and the clamping diode DN, holding the output Vo at the level set by the negative clamp voltage Vnc. When Vin switches positive, QN2 is turned off by QN1 and Itp is switched to QP2, charging the timing capacitor Ct positively until the positive clamping diode DP turns on and holds the output as determined by Vpc. The process is reversed when Vin again switches negative. To achieve a fast minimum transition time Ct needs to be as small as possible. Therefore a buffer amplifier Ao is usually included between the resulting high impedance timing node and the ultimate output Vout of the circuit. Many variations and elaborations of this circuit with respect to switching QP2 and QN2, output clamping arrangements and other aspects exist. All of these variations can provide independent control of the positive and negative output transitions by controlling Itp and Itn.

In the context of fast IC processes these circuits have serious drawbacks. A PNP device QP2 is needed. The fastest available PNPs in complementary processes are much slower than the NPNs and seriously degrade the speed of the circuit. The controllable pull-up current source Itp is also difficult to make using NPNs only. The power supply voltages needed are likely to exceed those available in a logic environment. Also a multichip solution is undesirable, as noted above.

What is desired is a high speed variable transition time generator that uses NPN devices only to provide high speed on a single chip while using available logic power supply voltages.

SUMMARY OF THE INVENTION

Accordingly the present invention provides a variable transition time generator having a pair of NPN emitter followers driving two ends of a timing capacitor with corresponding current timing sources, the NPN emitter followers having a differential input signal applied to them. A differential buffer amplifier applies the voltage across the timing capacitor to an output. D.C. offset compensation for unequal timing current sources is provided by another pair of steady state NPN emitter followers, the outputs of which are buffered by another amplifier and combined with the output from the buffer amplifier. Finally step compensation is provided by a third amplifier having the differential input signal applied to it, and having the output also combined with the output from the buffer amplifier to produce a final output signal with simultaneous and independently controlled pulse transitions for both edges.

The objects, advantages and novel features of the present invention are apparent from the following detailed description when read in conjunction with the appended claims and attached drawing.

DESCRIPTION OF THE PREFERRED EMBODIMENT

Figure 2:
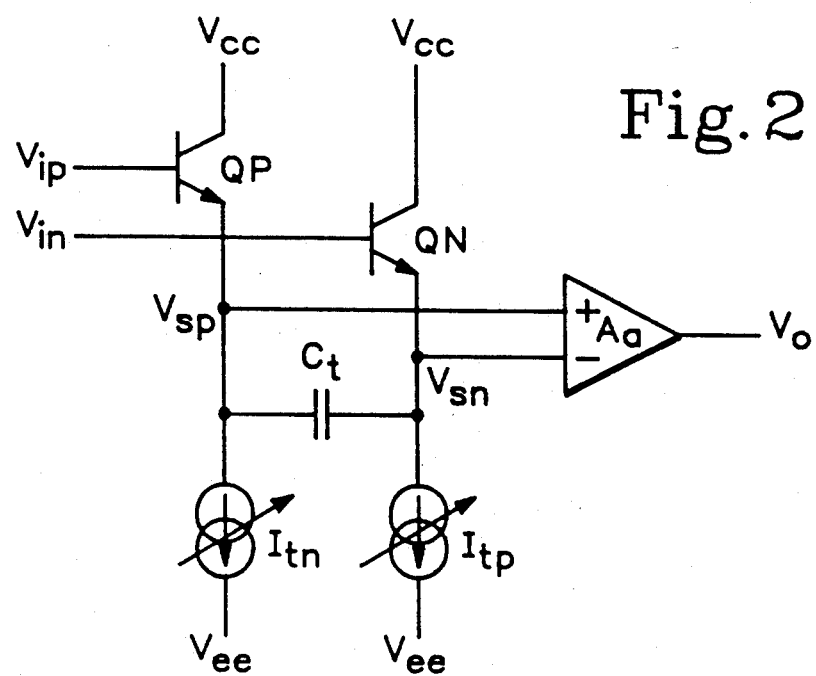
FIG. 2 is a schematic view of a basic circuit kernel of a variable transition time generator according to the present invention.

Referring now to FIG. 2 a variable transition time circuit is shown having a pair of emitter follower transistors QP, QN driving the two ends of a timing capacitor Ct. A corresponding pair of timing sources Itn, Itp provide the current for the respective emitter followers QP, QN. A differential input signal Vip, Vin is applied to the respective bases of the emitter followers QP, QN to produce voltages Vsp, Vsn at the emitters and across the timing capacitor Ct. The emitter voltages Vsp, Vsn are input to a differential buffer amplifier Aa that applies the voltage across the timing capacitor Ct to the output Vo.

Figure 3:
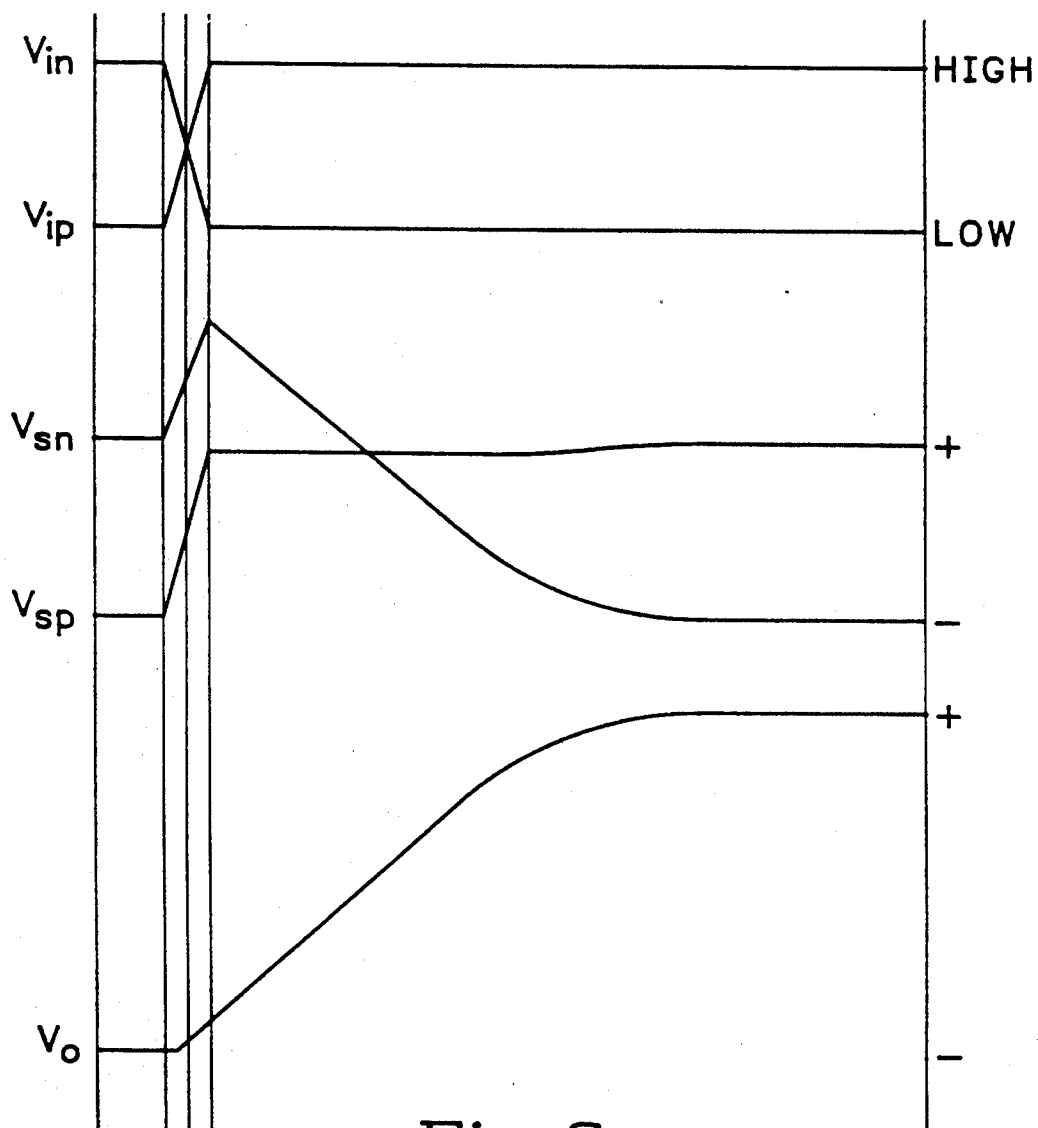
FIG. 3 is a diagrammatic view of the waveforms for the basic circuit kernel of FIG. 2.

The operation of this circuit is described with respect to FIG. 3 by assuming balanced inputs Vip, Vin, although this is not a necessary condition for its operation. For an initial condition assume that Vip is low and Vin is high, such as 0.5 volts above Vip, and that the timing currents Itp, Itn are equal. Then the emitter voltages Vsp, Vsn at the ends of the timing capacitor Ct are one base-emitter voltage drop below the respective bases and the voltage across Ct is approximately 0.5 volts, the output voltage Vo being −0.5 volts to match the voltage across the amplifier inputs connected as shown. Now when Vip switches quickly to high and Vin simultaneously switches to low, due to emitter follower action of Qp Vsp increases by 0.5 volts. However since no currents are available to instantaneously change the voltage across Ct, Vsn also increases by 0.5 volts and the current through QN is cut off because its base-emitter junction is reverse biased. The timing current Itp flowing through Ct pulls Vsn negative until QN conducts again. The voltage across Ct, and the output Vo, have changed from −0.5 to +0.5 volts, the transition time being the time needed for Itp to charge Ct through the one volt change in Vip-Vin. The goal of a variable transition time controlled by Itp is achieved.

When Vip and Vin switch back to their original levels of low and high respectively, the output Vo switches from +0.5 to −0.5 volts with a transition time determined by Ct and Itn. Thus the positive and negative transition times are independently controllable by Itp, Itn.

Figure 1:
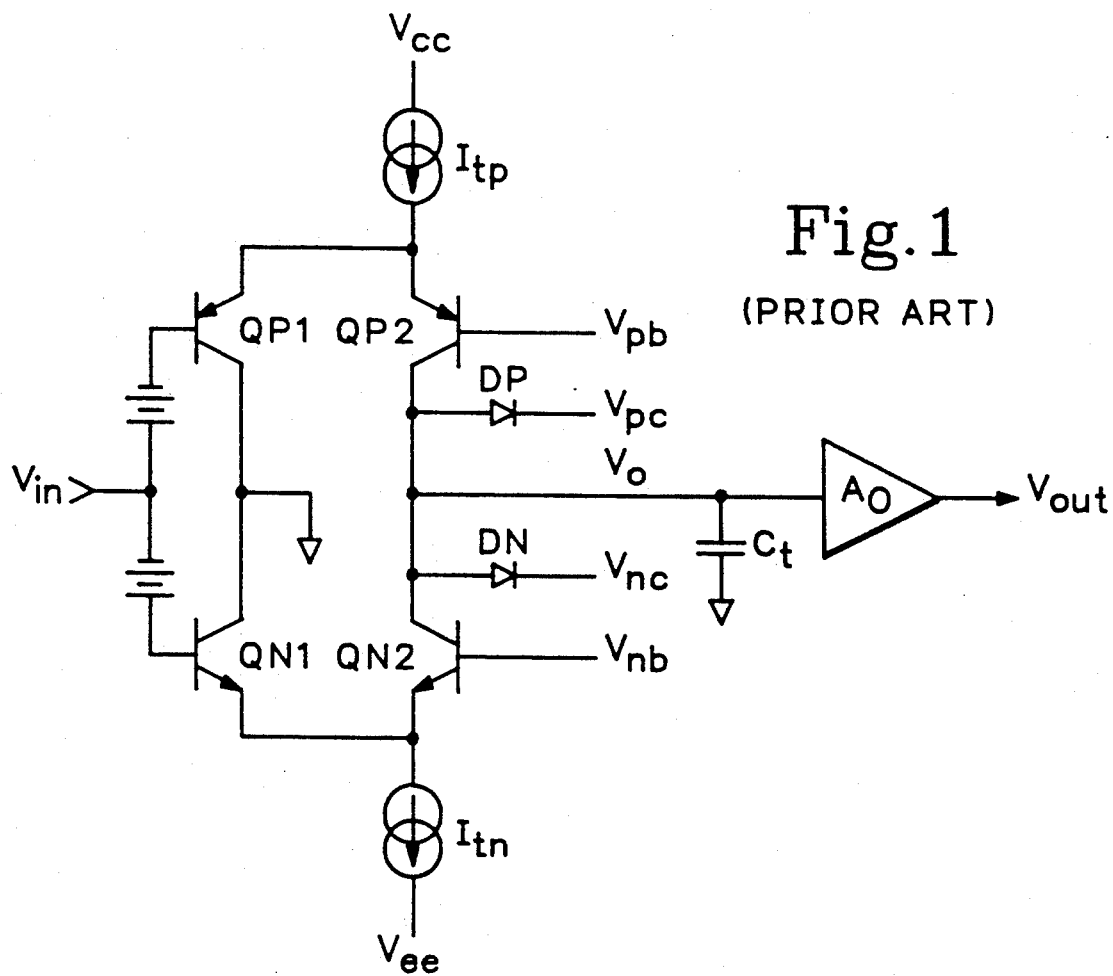
FIG. 1 is a schematic view of a prior art pulse transition time control circuit.
Figure 7A:
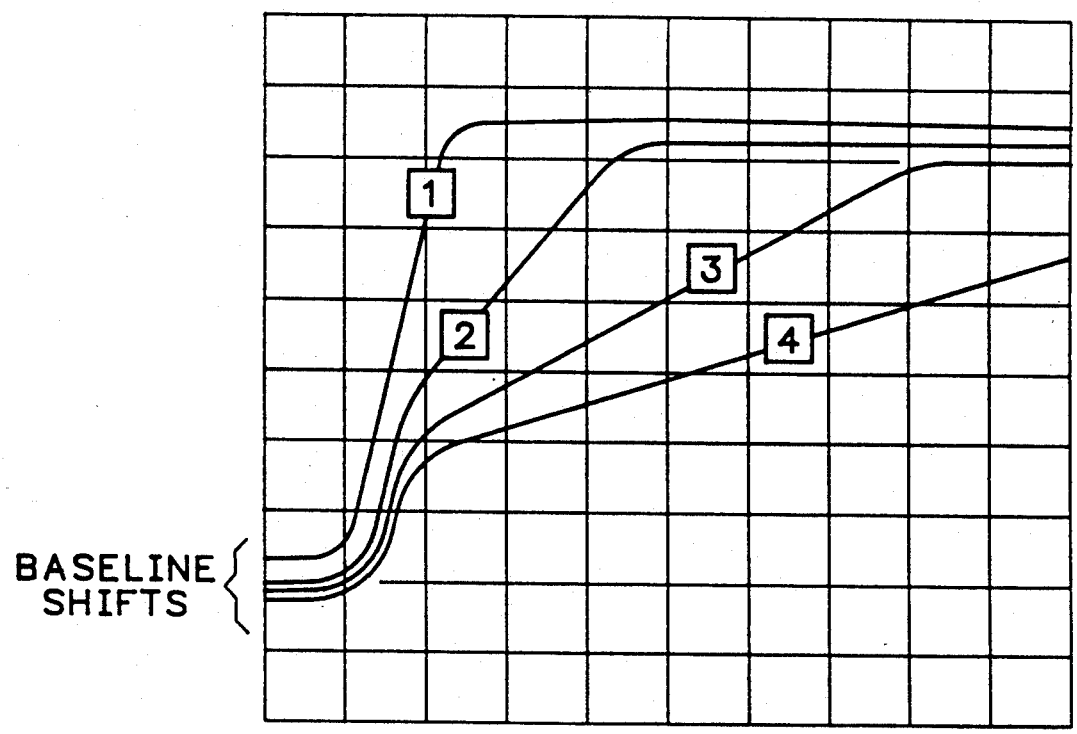
FIGS. 7A and 7B present a comparative diagrammatic view of the performance of the variable transition time generator according to the present invention without (FIG. 2) and with (FIG. 6) offset and step compensation.

If Itp and Itn are not equal, the steady state base-emitter voltages of QP, QN are no longer equal, meaning that the steady state positive voltage across Ct, with Vip-Vin positive, is not equal to the negative voltage, with Vip-Vin negative. This has the effect of adding a d.c. offset to the output voltage Vo as shown by the baseline shifts of the waveforms in FIG. 7A. With ideal transistors this amounts to 60 mV for a 10:1 current ratio. Practical high speed transistors have extrinsic emitter resistance that can significantly increase the offset. This is not acceptable in instrument applications. The prior art simple diode clamping of FIG. 1 also suffers this offset problem. In prior art circuitry more complex clamping circuits using feedback have been used to reduce the effective clamp resistance and the resulting offset. However feedback loops with enough gain to be useful and which can drive a capacitive load like Ct have too much loop delay, are slow and/or have oscillatory responses, and so reduce the circuit speed well below the inherent device speed.

Figure 4:
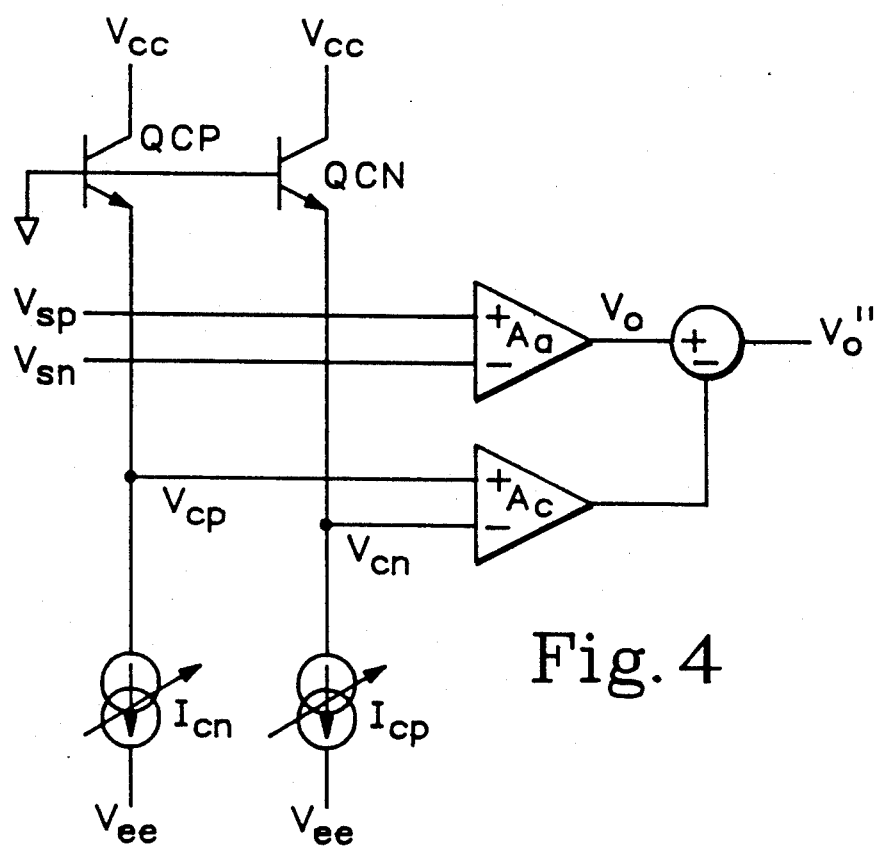
FIG. 4 is a schematic view of a d.c. compensation circuit for the variable transition time generator of FIG. 2 according to the present invention.

Accordingly a compensating technique is used as shown in FIG. 4. Auxiliary currents Icp, Icn are controlled so that they are equal to Itp, Itn respectively. These currents are drawn from the emitters of QCP, QCN that have the same geometry as QP, QN. Therefore the difference between the emitter voltages Vcp, Vcn of QCP, QCN equals the static Vbe difference between QP, QN. This difference is picked off by a differential amplifier Ac with gain equal to Aa and subtracted from the output of the buffer amplifier Aa, thereby cancelling the offset.

With offset cancellation this circuit offers some benefits even in low speed applications. It is inherently symmetric with respect to positive and negative output transitions, there are no high gain active clamps to become unstable, and the same polarity and type of controlled current source is used for both transitions.

To obtain high speed operation Ct must be as small as possible. This presents a problem due to the parasitic capacitances from the ends of Ct to other nodes. For example from the emitter of QN there are junction and diffusion capacitances to its base, the collector to base and to substrate capacitance of the current source Itp, the input capacitance of Aa, and the capacitance to the substrate of Ct itself. The effect of these capacitances also is shown by the waveforms in FIG. 7A. As Vin switches positively charge sharing occurs between Ct and the parasitic capacitances so that the voltage across Ct, and the output voltage Vo, now contain a substantial initial step, followed by the ramp due to charging by Itp.

Figure 5:
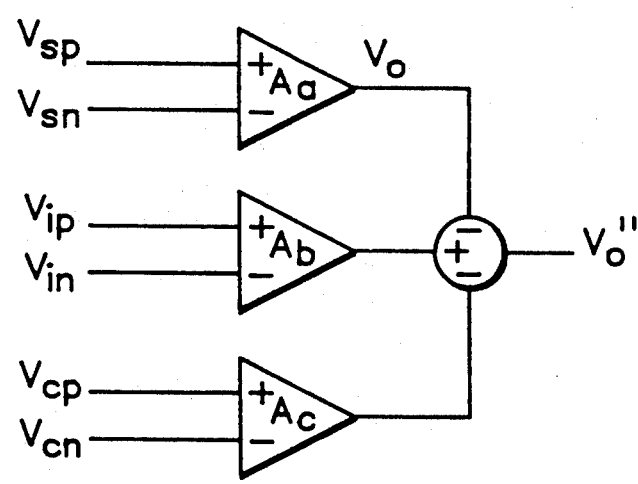
FIG. 5 is a schematic view of a step compensation circuit for addition to the variable transition time generators of FIGS. 2 and 4 according to the present invention.

A feedforward cancellation technique as shown in FIG. 5 is used to remove the step. The step is reasonably proportional to the differential input signal Vip-Vin, and has about the same risetime. A cancelling amplifier Ab driven from the same input provides a suitably scaled output, which is subtracted from the output of the buffer amplifier Aa. With the appropriate gain of amplifier Ab the step is cancelled, leaving only the ramp as required. The ramp now has less amplitude than the input signal, so the gains of the amplifiers As, Ab, Ac need to be increased to compensate.

Figure 6:
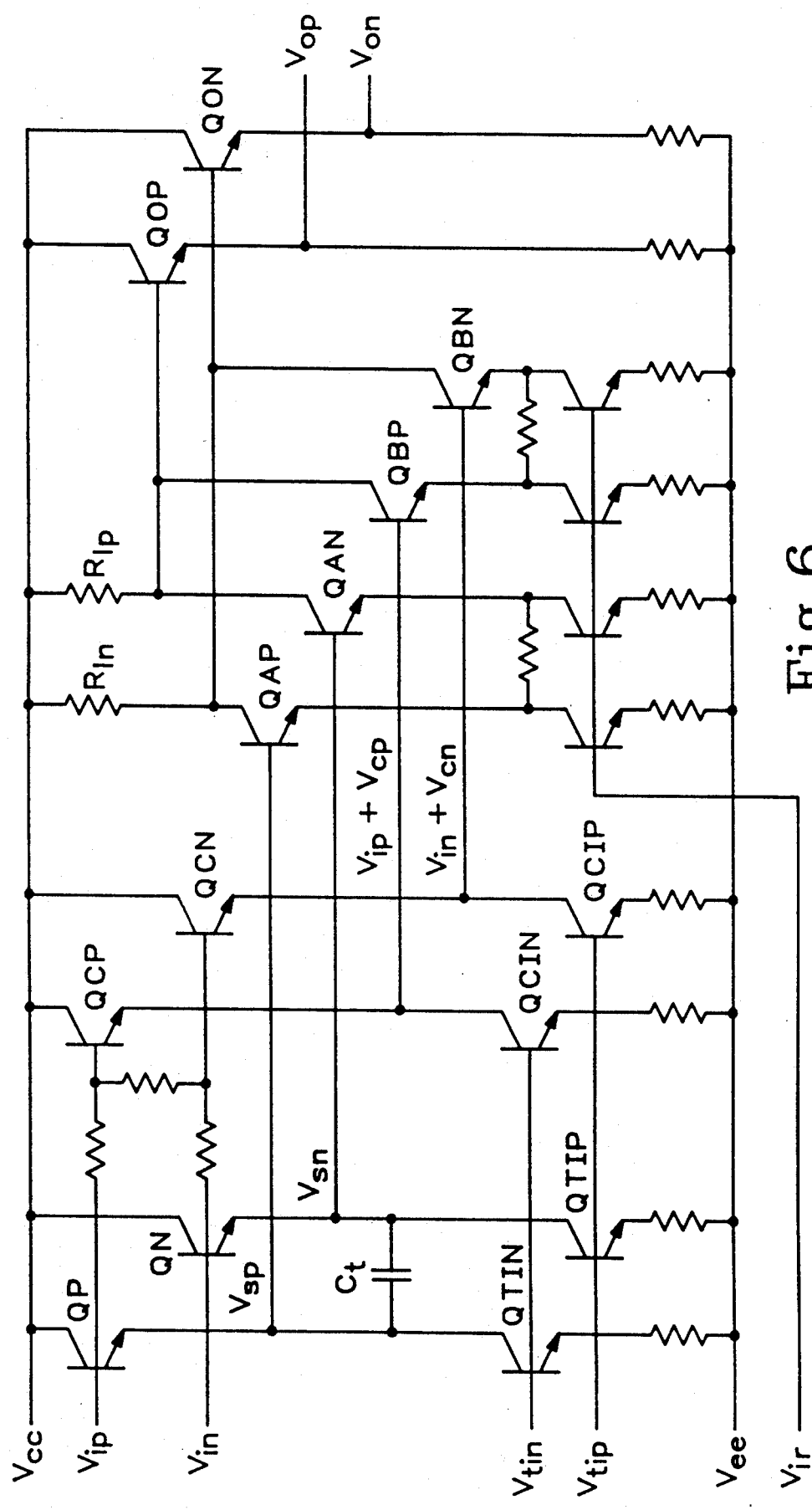
FIG. 6 is a schematic view of a complete circuit for the variable transition time generator according to the present invention.
Figure 7B:
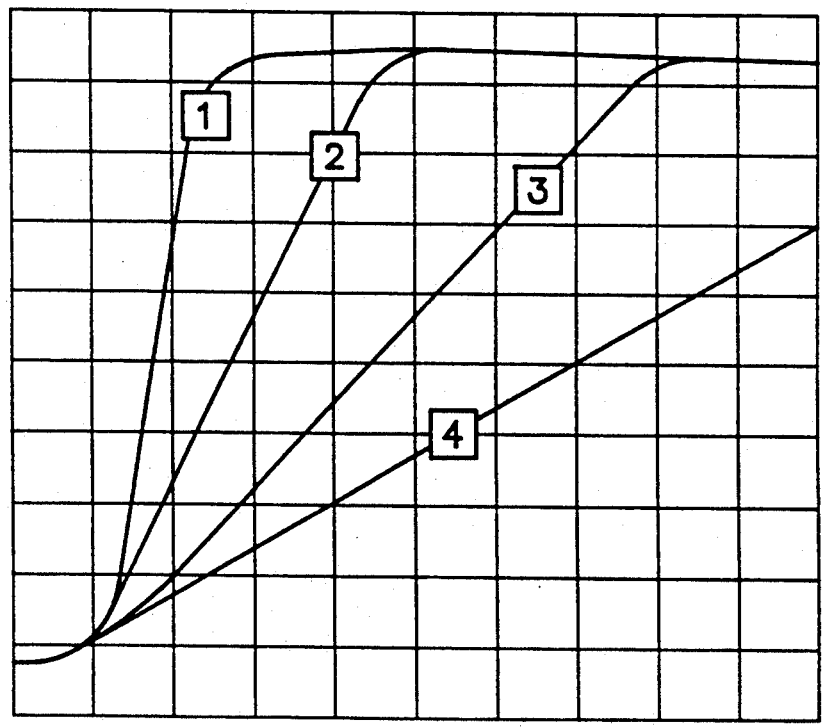
Figure 8:
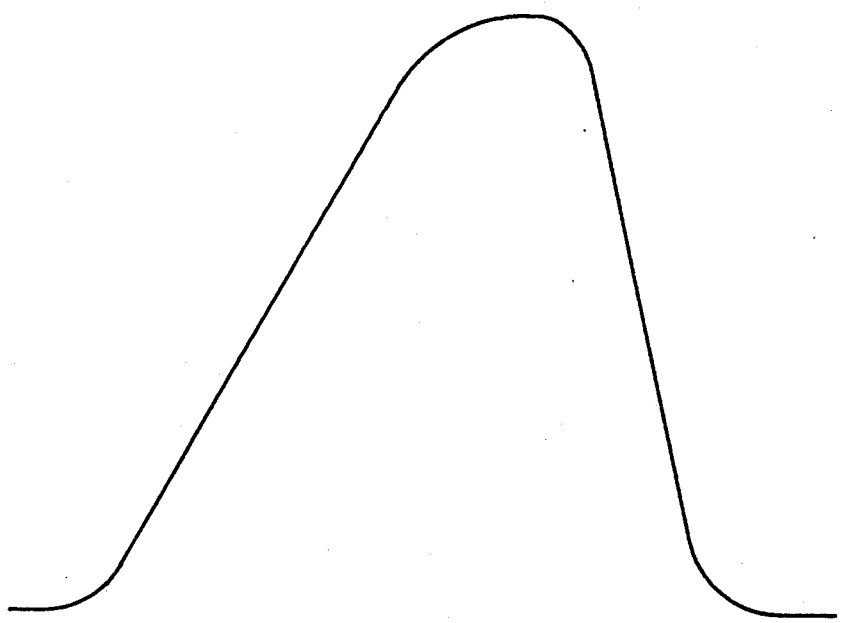
FIG. 8 is a diagrammatic view of a pulse with combined slow and fast transitions produced by the variable transition time generator according to the present invention.

A complete transition time control circuit is shown in FIG. 6. The timing current sources are Qtip, Qtin, the ramp amplifier is Qap, Qan and associated parts generating the output voltage Vo across load resistors Rlp, Rln, and output emitter followers Qop, Qon provide low impedance drive to subsequent circuits. The d.c. offset modelling devices QCP, QCN, biased by the compensating current sources Qcip, Qcin, also perform the task of buffering a portion of the input signal Vip, Vin for step cancellation. This allows a single amplifier Qbp, Qbn and associated circuitry to subtract both the offset correction and the step correction from the output Vo by injecting cancelling currents into the output load resistors Rlp, Rln. The performance of the complete circuit of FIG. 6 is shown by the waveforms in FIG. 7B corresponding to the same current values of Itp represented by the related waveforms in FIG. 7A, which current values span the feasible range, with constant Itn equal to Itp for waveform [2]. The d.c. offset, though still present, is greatly reduced. A small residue of the input step is still visible in the slowest risetime waveform [4], but most of the step seen in the corresponding dotted waveform [4] is gone. The ability of the circuit to simultaneously produce fast and slow opposite polarity transitions is illustrated in FIG. 8.

Obviously the circuit details of the implementation can be varied while still achieving similar results. Also other device types, such as FETs, and process technologies, such as GaAs, may be used.

The present invention provides a variable transition time generator that simultaneously provides independently variable pulse transition times at both edges of a pulse by using a differential input emitter follower configuration to drive both ends of a timing capacitor, with timing current sources for each emitter follower transistor. Using NPN bipolar transistors or the like produces high speed, and d.c. offset and step cancellation circuits further improve the response of the circuit.

What is claimed is:

1. An electrical pulse generator having independently variable transition times between first and second pulse amplitude levels, comprising
    input circuit means for receiving a differential input signal and providing a differential output signal,
    a timing capacitor coupled across the differential output signal,
    circuit means for buffering the differential output signal and providing a pulse output signal having first and second amplitude levels,
    means comprising a first variable timing current source coupled to said input circuit means for controlling the transition time of the pulse output signal from said first to said second amplitude level,
    means comprising a second variable timing current source coupled to said input circuit means for controlling the transition time of the pulse output signal from said second to said first amplitude level,
    means for providing a compensating d.c. offset signal in response to current variations in the first and second variable timing current sources, and
    means for combining the d.c. offset signal with the pulse output signal to provide a compensated pulse output signal.

2. A pulse generator as recited in claim 1 wherein the d.c. compensation offset signal providing means comprises:
    a pair of transistors having collectors coupled to a voltage rail, bases coupled to a common bias source, and emitters;
    a pair of variable compensation current sources that track the current flow in the variable timing current sources, one variable compensation current source being coupled to the emitter of one of the transistors and the other variable compensation current source being coupled to the emitter of the other one of the transistors to provide a differential d.c. compensation signal between the emitters; and
    means for deriving the d.c. compensation signal from the differential d.c. compensation signal.

3. A pulse generator as recited in claim 1, further comprising means for providing in response to the differential input signal a step compensation signal for combination with the pulse output signal in the combining means to provide the compensated pulse output signal.

4. A pulse generator as recited in claim 3 wherein the step compensation signal providing means comprises a differential amplifier having the differential input signal as inputs and the step compensation signal as output.

5. A pulse generator as recited in claim 3 further comprising means coupled to the combining means for providing a buffered compensated output signal from the compensated output signal.

* * * * *